United States Patent [19]

Slomcenski

[11] 3,935,531

[45] Jan. 27, 1976

[54] ELECTROMETER WITH LOW VOLTAGE INDICATOR

[75] Inventor: Robert J. Slomcenski, Rochester, N.Y.

[73] Assignee: Xerox Corporation, Stamford, Conn.

[22] Filed: Dec. 16, 1974

[21] Appl. No.: 532,785

[52] U.S. Cl. .................... 324/72; 324/29.5; 320/48
[51] Int. Cl.² ......................................... G01R 31/02
[58] Field of Search.......... 324/29.5, 72; 340/248 B, 340/248 C, 248 D, 249; 320/48

[56] References Cited
UNITED STATES PATENTS

| | | | |
|---|---|---|---|
| 3,118,137 | 1/1964 | Vincent | 324/29.5 |
| 3,832,629 | 8/1974 | Cernek | 324/29.5 |

*Primary Examiner*—John Kominski
*Assistant Examiner*—Michael J. Tokar

[57] ABSTRACT

An electrometer system particularly adapted for non-contact measurement of electrostatic charges in electrostatography, such as the charge level on photoreceptor surface areas in xerographic machines. The electrometer circuit has a very high impedance normally floating input, and a simple D.C. measurement circuit. The measurement circuit output can be read by a conventional test meter. The electrometer is controlled by a simple switching arrangement providing an automatic zeroing position in which the initial level of the input circuit is automatically reset by a feedback amplifier from the output to compensate for any temperature induced or other variations in the measurement circuit. The power supply voltage is automatically monitored and the output meter is driven to a non-zeroing position in response to a low supply voltage by a feedback amplifier circuit operative only in the zeroing position, overriding the automatic zeroing circuit.

7 Claims, 1 Drawing Figure

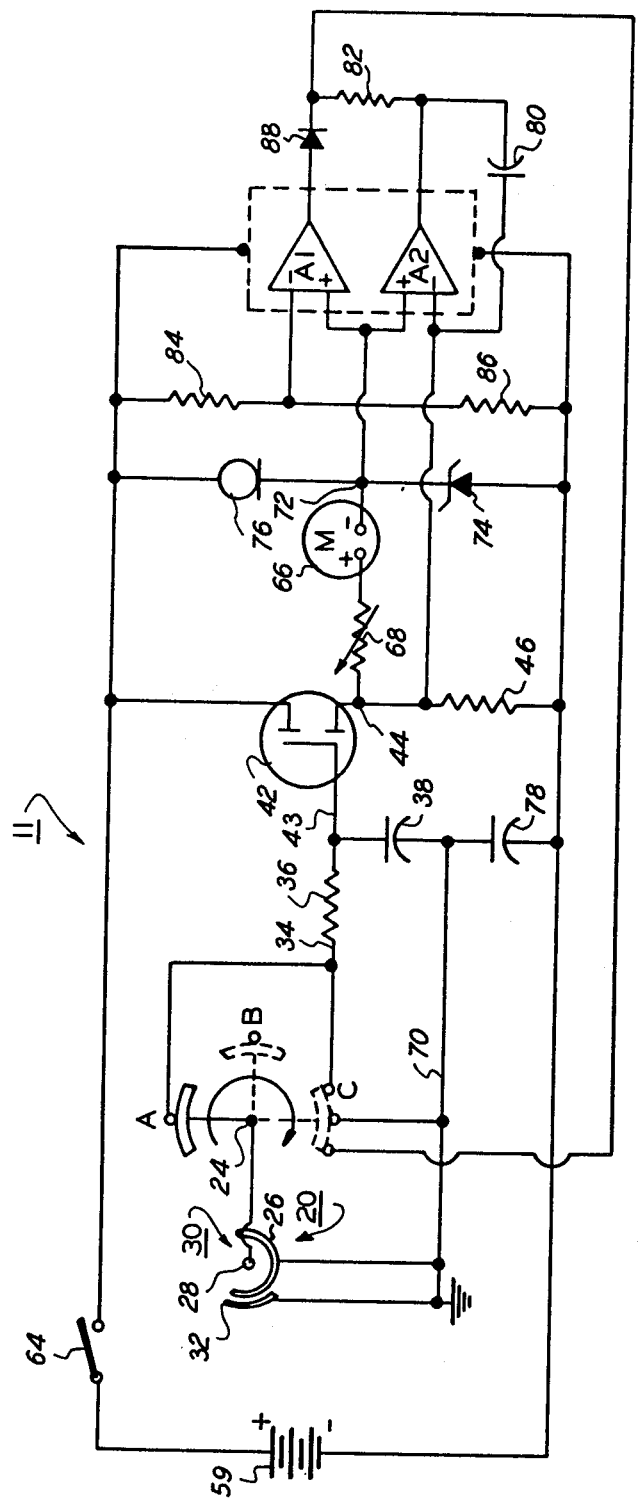

ELECTROMETER WITH LOW VOLTAGE INDICATOR

This invention relates to electrometers, and more particularly to improved circuitry in electrometer systems for measuring electrostatic charges.

The present invention is an improvement directly applicable to the electrometer circuitry described in U.S. Pat. No. 3,835,380 issued Sept. 10, 1974 to John L. Webb, and also described in allowed U.S. application Ser. No. 388,505 by James M. Hardenbrook et al. Accordingly this patent and application are hereby incorporated by reference [MPEP 608.01 (p)]. The references cited or referenced in this patent and application are also made a part of this application to the extent relevant.

Of the references incorporated, particular attention is directed to U.S. Pat. No. 3,611,982, and Column 7, line 73 through Column 8, line 29 thereof, describing a system for cyclically grounding an electrometer input circuit. U.S. Pat. No. 3,667,036 is also noted.

An exemplary embodiment of the present invention is shown and described hereinbelow as an improved schematic circuit for the electrometer described in the incorporated U.S. Pat. No. 3,835,380. Accordingly, said electrometer and its operation and associated exemplary xerographic processes and apparatus need not be described herein, and the following detailed discussion relates to the subject circuit improvements.

The present invention provides an improvement whereby the output signal is automatically driven to a high level, rather than rezeroed in the normal rezeroing operations, to indicate a weak power supply condition.

Further objects, features and advantages of the present invention pertain to the particular apparatus, steps and details whereby the above-mentioned aspects of the invention are attained. Accordingly, the invention will be better understood by reference to the following description and to the drawing forming a part thereof, wherein:

The FIGURE is a schematic view of an exemplary electrometer circuit in accordance with the present invention.

Referring now to the FIGURE, there is shown therein an electrometer circuit 11 as an example of the present invention, which circuit 11 may be utilized in measuring the charge on an imaging surface in an electrostatographic system. For convenience in comparing this circuit 11 with the circuit 22 of FIG. 1 of the incorporated U.S. Pat. No. 3,835,380, the same reference numbers and letters have been used for generally corresponding components. As in U.S. Pat. No. 3,835,380, FIG. 1, it may be seen that in the circuit 11 here the electrometer probe 20 electrode 28 is connected to the electrometer circuitry through a three position (A-B-C) switch 24. The probe 20 has a probe shield 26 containing the probe electrode 28 therein. The probe electrode 28 senses the charge on the surface being measured through a probe window 30 in the probe shield 26. This probe window 30 is coverable by a shutter 32 upon rotation of the probe shield 26. The probe shield 26 and shutter 32 are commonly tied together and to switch 24 position C.

Further in common with FIG. 1 of U.S. Pat. No. 3,836,380, when the three function (schematic) switch 24 is in its A position only the probe electrode 28 is directly electrically connected to the input circuit or lead 34 of the electrometer circuit. Also in this A switch position the probe electrode 28 is exposed through the probe window 30 and is not covered by the shutter 32. This switch position A provides the electrometer measuring condition in which voltage is induced on the probe electrode 28 corresponding to the sensed level, which voltage is proportional to the internal (shield) capacitance of the probe 20 plus its connected input circuitry relative to the probe-to-measured surface capacitance.

The input lead 34 connects through a 10 megohm input protective resistor 36 to one side of a capacitor 38 of 150 picofarads. The opposite side of capacitor 38 is grounded, connecting with switch terminal C, shield 26, shutter 32, and the electrometer chassis (not shown). However, in the present circuit 11, in contrast to the circuit 22, this common ground line (connecting conductor) 70 does not connect with either terminal of the power supply 59, which is a single 9 volt battery here. The function of the capacitor 38 is the same in both circuits 11 and 22. The induced voltage from the electrode 28 is stored across the capacitor 38 and is continuously applied to the gate lead 43 of a metal oxide semiconductor field effect transistor (MOSFET) 42 such as a 2N3796.

The MOSFET 42 has a 6.8 K ohms resistor 46 connected from its source lead 44 to one side of battery 59 to form a low impedance "source follower" circuit whose output voltage at its source 44 closely follows its input at its gate 43. The other terminal of the battery 59 connects through switch 64 to the drain lead of MOSFET 42 to provide the MOSFET operating voltage and current.

Connecting with the source lead 44 of the MOSFET 42, to respond to the output voltage across the resistor 46, is one terminal of an output meter 66, in series with a scale calibrating variable resistor 68 of 100 K ohms. Unlike the circuit 22, the circuit 11 has a fixed reference voltage line 72 connected to the other lead of the meter 66. The reference voltage level on line 72 is fixed (independent of power supply voltage) by a connecting zener diode 74, here one providing 4.3 volts. The current through this zener diode 74 is held constant by a connecting current regulator diode 76. This provides greater reference voltage stability and extended battery life. Here the diode 76 is a type 1N5291 holding the current to 0.56 milliamperes.

The MOSFET 42 has an extremely high input resistance, so that any charge stored on the capacitor 38 and applied to the gate 43 will be discharged very slowly. This very high gate-to-ground resistance of the MOSFET 42 is the only charge leakage path of significance for the charge applied to the input lead 34 in switch 24 position A. The low leakage capacitor 38 is the only other connection between the input lead 34 and ground in switch positions A or B.

The meter 66 here is a conventional volt-ohm-meter which provides full scale meter deflection for a 30 microampere current through the meter.

As in the previous circuit 22, as soon as the switch 24 is rotated out of the A position the probe electrode 28 is disconnected from the input lead 34. The B position of the switch 24 is a "hold" or "read" position in which the input lead 34 "floats" and is not connected to the probe electrode 28, only the capacitor 38. Thus, whatever charge was last sensed on the electrometer probe 20 as switch 24 is moved from A to B is stored on the capacitor 38 and continuously applied to the gate input 43 of the MOSFET 42. Thus, the operator can quickly manually take an instantaneous charge measurement in the A position, and, if desired, then hold and subsequently read it at leisure by switching to the B position, relying on the stability of the circuit 11. This stability is enabled by the extremely low leakage path of the input circuit 34 retaining the stored charge on the capacitor 38, and by the MOSFET 42 and its associated circuitry providing fully isolated low impedance measurement output with a stable, single-stage, voltage amplification gain of less than 1. No amplification is operative in the switch 24 A or B positions other than that provided by MOSFET 42. Thus, DC amplifier drift or instability problems associated with many high gain amplifiers and feedback circuits are not present in the circuit 11. Oscillators, choppers, clamps, continuously moving probe shutters, or AC circuits are not utilized here. This same circuit stability enables the electrometer probe to be able to accurately measure varying charge levels in the switch 24 A position without drift for a substantial time period after the input circuit is initially "zeroed," even though the input lead 34 is freely electrically floating in both the A and B switch positions.

The C position of the switch 24 is utilized in the circuit 11 for automatically initially zeroing (resetting) the electrometer. In this C switch position the probe electrode 28 and the probe shield 26 and also the input lead 34 are all connected directly to the ground line or bus 70. This grounds the entire input circuit including both sides of capacitor 38 (which is effectively shorted) and including the input 43 of the MOSFET 42. In this same switch position C the probe window 30 is rotated under the probe shutter 32 to close it, so that the probe electrode 28 "sees" only a grounded surface for reference. The operator is prevented from zeroing the meter 66 while the probe electrode 28 is still exposed through window 30 to an electrostatic field with the circuit 11. (That would cause an erroneous subsequent measurement).

Referring to FIG. 1 of incorporated U.S. Pat. No. 3,835,380, it may be seen that there the two power supply batteries 58 and 60 are fixed electrically relative to the electrometer circuitry, and rezeroing of the meter 66 is done by operator manual adjustment of the variable resistor 54.

In contrast, in the present circuit 11, a quite different arrangement is provided, as will be further described herein, in which the output voltage of the circuit 11 (relative to the fixed reference voltage point 72) is fed back through an operational amplifier A2 to the ground bus 70 so as to "reset" the ground bus 70 voltage level across a much larger capacitor 78 relative to the battery 59 voltage. The capacitor 78 connects between the ground bus 70 and one side of the power supply 59. A value for capacitor 78 of 1.5 microfarads is appropriate.

The circuit 11 here contains a low power integrated circuit shown in dashed outline containing two independent operational amplifiers A1 and A2, both powered by a single battery 59. In switch 24 positions A and B, amplifier A2 is disconnected from ground bus 70, and thus the power supply 59 in switch positions A and B "floats" at a bias voltage level relative to the ground bus 70. This bias voltage level is set by the voltage applied across capacitor 78 from the output of amplifier A2 in switch position C. (Nominally around 2 volts).

Low power op-amp A2 and its feedback capacitor 80 act as an integrator, comparing the "reference voltage" on line 72 to the output voltage at the MOSFET 42 source lead 44, these being the two op-amp A2 inputs. The op-amp A2 output charges capacitor 78 through a 10 K ohm resistor 82 and switch 24 position C until there is a voltage bias operating point reached for the MOSFET gate 43 that causes the output voltage at the MOSFET source lead 44 to equal the "reference voltage" at 72, since those are the two opamp A2 inputs. This feedback self-equalization of the two op-amp A2 inputs also equalizes or zeroes the two meter 66 inputs, since they are the same. The bias voltage across capacitor 78 establishes the voltage difference between ground on line 70 and one terminal of the supply voltage 59, which will cause the current through the meter 66 to become zero in switch position C. Thus, amplifier A2 automatically zeroes the output voltage and meter 66 whenever switch 24 is in position C. This removes any need for manual zero adjustment or temperature compensation circuitry. Although no specific temperature compensation has been incorporated into the circuit 11, the circuit is "rebalanced" automatically whenever switch 24 is put in position C.

It will be noted that this automatic zero feature as applied to the DC electrometer circuit 11 operates to change the active or input level of the voltage comparator circuit rather than changing the reference or output circuit level. It will also be noted that the entire circuit 11 operates essentially independently of the battery 59 voltage as long as the battery output is greater than the zener 74 operating voltage and as long as the battery can supply the necessary circuit current (approximately 1.5 milliamperes).

In the A or B positions of switch 24 the output of op-amp A2 will continue to "track" whatever sensed input voltage is on lead 34, as reproduced at the source lead 44 output of MOSFET 42. However, the output of op-amp A2 is not connected to anything in these switch 24 positions A or B and thus there is no amplification or feedback effect on the electrometer measurements.

This resetting by amplifier A2 of the input ground level above one pole of the power supply to zero the output against a fixed reference voltage is clearly distinguishable from the cited prior art arrangement for merely periodically re-grounding the input. The latter does not compensate for output level shifts such as those due to amplifier gain and internal bias changes which are not just due to input bias level drifts. The circuit 11 here rezeroes the output regardless of such circuit changes as gross changes in power supply voltage or even changes in the reference voltage level.

Note that in the switch 24 C position that capacitor 38 is effectively shorted through the switch 24 and resistor 36. Thus, capacitor 38 has no effect on the circuit in this switch position and only capacitor 78 is charged by the feedback voltage from amplifier A2. Both sides of capacitor 38 and the entire input circuit 34 are uniformly raised to the same feedback voltage level from A2.

The size of capacitor 78 should be as large as practicable so as to maintain the feedback charge level or bias from A2 thereon as a constant as long as possible. However, the value of capacitor 78 should allow a reasonably rapid full charging through resistor 82.

As noted, in switch 24 positions A and B input circuit 34 is isolated from ground bus 70 by capacitor 38 and totally disconnected from amplifier A2, so that there is no loading of the very high impedance input circuit. Also, since the feedback bias level from A2 (the power supply to ground voltage) is generated and maintained across capacitor 78 and not capacitor 38, the magnitude of the input signal which appears across capacitor 38 in switch position A is not affected by changes in that bias level.

The novel integral "low battery" indicator circuit will now be described whereby the output meter 66 is caused to deflect upscale, preferably by at least one-third of its full scale reading, to indicate to the electrometer operator that an accurate reading cannot be taken by the electrometer due to a low battery voltage condition. When this low battery indicator circuit operates the meter 66 will not zero in the switch 24 zeroing position C, contra its normal operation, and instead will display a high output reading to signal the need for a battery change.

Low power op-amp A1 performs this low battery voltage indicator function together with resistors 84 and 86. The resistors 84 and 86 in series across the battery 59 provide a voltage tap therebetween to the inverting input of the op-amp A1. This voltage tap level is a percentage of the total operating battery voltage. Resistor 84 and 86 values of 27 K ohms and 51 K ohms, respectively, are appropriate. This voltage tap level is compared by op-amp A1 to the "reference voltage" on line 72 which is connected to the other input of A1. The op-amp A1 output will therefore remain at its most negative power supply voltage level as long as the battery provides a voltage greater than the reference voltage. Diode 88 blocks this normal negative output of op-amp A1 from affecting the circuit 11 in any way. However, when the battery 59 voltage falls below the desired level, the voltage tap level at the junction of resistors 84 and 86 will fall below the "reference voltage" level and then the op-amp A1 output will switch from negative over to its most positive supply voltage level. This positive output level, conducting through diode 88 and switch 24 position C, (only) will charge capacitor 78 essentially up to the full positive supply voltage level. Resistor 82 provides a "priority" for this "weak battery" indication signal over the above-described "automatic zero" feature, i.e., the output of op-amp A1 overrides that of op-amp A2 when amplifier A1 has a positive output, because of the resistor 82 in the output of A2.

The full positive supply voltage applied to capacitor 78 and the input circuit 34 by amplifier A1 in switch 24 position C causes the MOSFET 42 to turn on, causing the output voltage at the MOSFET source 44 to become much more positive than the "reference voltage" on line 72. This provides an upscale reading on the meter 66 whenever the battery 59 is weak and switch 24 is in position C. Since, normally, with switch 24 in position C, the meter 66 reads zero due to the automatic zero feature, this immediately notifies and requires the operator to charge the battery 59 in order to continue use of the electrometer.

It may be seen that the above-described "weak battery" indicator circuit uses very little power until it gives its output warning, since its output is normally blocked by diode 88. Further, even when operating, it uses the existing measurement output meter 66 rather than requiring a separate warning light, buzzer or the like output device as is typically used for low battery indicators. Even further, this low battery function makes use of the same input circuit and MOSFET amplifier circuit and part of the same feedback circuit as the automatic meter re-zeroing function, rather than requiring a separate amplifier to provide its output signal.

The allowable low voltage level to which the supply voltage will be allowed to drop before actuation of the low voltage indicator circuit can be selected by selecting the ratio of resistors 84 and 86. Alternatively the reference voltage level can be changed by changing the zener diode 74 to one with a different zener voltage. However, the latter change may require other circuit value changes for proper operating conditions.

It may be seen that there is dislcosed here a simple structure and circuit controlled during operation by only single manual three position switch 24. That is, the relatively simple circuit 11 associated only with the measurement switch 24 accomplishes all of the abovedescribed circuit functioning automatically.

It will be appreciated that the circuit disclosed herein may be used in fully-automatic electrometer systems, particularly those built into a xerographic apparatus for automatic diagnostics or automatic control of one or more xerographic processing elements. In that case the operation of the switch 24 may be automatic, and various functions of this switch may be replaced by electromechanical relays or the like. Likewise, the "zero" output may be any desired baseline voltage or current level for logic or control purposes indicative of the baseline measurement input condition.

In conclusion, it may be seen that there has been disclosed herein a novel and improved electrometer system particularly suited for simple and low cost measurement of surface charges. While the exemplary embodiments described herein are presently considered to be preferred, it is contemplated that numerous further variations and modifications within the purview of those skilled in the art can be made herein. Thus, for example, the present invention is not intended to be limited to the specific exemplary circuit components, values, structures and applications disclosed herein, where operative equivalents can be provided. The following claims are intended to cover all such variations and modifications as fall within the true spirit and scope of the invention.

What is claimed is:

1. In an electrometer system for non-contact detection of an electrostatic charge comprising a probe electrode and an electrometer circuit having a power supply voltage and including an electrically floating input circuit for said probe electrode, said electrometer circuit providing an output signal to an output level indicator means indicating a voltage on said probe electrode, and wherein said electrometer circuit has zeroing means and switch means selectively connecting said zeroing means with said input circuit for normally providing zeroing of said indicator means with a zero output signal, the improvement comprising:
    reference voltage means providing a reference voltage,
    inhibited voltage comparison means comparing said power supply voltage against said reference voltage and providing an indicator signal output only in response to said power supply voltage falling below said reference voltage;
    and connecting means for connecting said inhibited voltage comparison means to said input circuit when said switch means is connecting said zeroing means to said input circuit to provide a non-zero output signal only when said indicator signal is produced by said inhibited voltage comparison means, said non-zero output signal corresponding to said indicator signal and being indicated by said indicator means during said normal zeroing of said indicator means, indicating a low power supply voltage.

2. The electrometer system of claim 1, wherein said zeroing means is automatic, and wherein said connecting means contains signal override means for overriding said zeroing means with said indicator signal only when said indicator signal is produced by said inhibited voltage comparison means.

3. The electrometer system of claim 1, wherein said connecting means is a part of said switch means.

4. The electrometer system of claim 1, wherein said inhibited voltage comparison means comprises an operational amplifier and rectifying means in the output of the operational amplifier providing inhibition of said output.

5. The electrometer system of claim 2, wherein said automatic zeroing means connects with said input circuit through said connecting means.

6. The electrometer system of claim 5, wherein said override means comprises a resistor connecting between said automatic zeroing means and said inhibited voltage comparison means but not connecting between said inhibited voltage comparison means and said input circuit.

7. The electrometer system of claim 1, wherein said indicator signal from said inhibited voltage comparison means drives said output signal and said indicator means to a substantial portion of the full output level thereof.

* * * * *